United States Patent
Laurent et al.

(10) Patent No.: US 9,277,684 B2
(45) Date of Patent: Mar. 1, 2016

(54) SELF-WRAPPING EMI SHIELDING TEXTILE SLEEVE AND METHOD OF CONSTRUCTION THEREOF

(71) Applicant: Federal-Mogul Powertrain, Inc., Southfield, MI (US)

(72) Inventors: Benoit Laurent, Trosly Breuil (FR); Patrick Thomas, 2 Rue de la Petite Vitesse (FR); Thierry Rodrigues, Ecouen (FR)

(73) Assignee: Federal-Mogul Powertrain, Inc., Southfield, MI (US)

( * ) Notice: Subject to any disclaimer, the term of this patent is extended or adjusted under 35 U.S.C. 154(b) by 234 days.

(21) Appl. No.: 13/801,889

(22) Filed: Mar. 13, 2013

(65) Prior Publication Data

US 2014/0262476 A1    Sep. 18, 2014

(51) Int. Cl.
*H05K 9/00* (2006.01)
*H05K 13/00* (2006.01)
*D03D 1/00* (2006.01)
(Continued)

(52) U.S. Cl.
CPC ............ *H05K 9/0007* (2013.01); *D03D 1/0058* (2013.01); *D03D 15/0027* (2013.01); *H02G 3/0481* (2013.01); *H05K 13/00* (2013.01); *D10B 2101/20* (2013.01); *D10B 2401/041* (2013.01); *H02G 15/18* (2013.01); *Y10T 29/49227* (2015.01)

(58) Field of Classification Search
CPC ...................................................... H05K 9/00
USPC .......... 174/379, 1–14 BH, 15.6–20, 30–31 S, 174/37–47, 480–507, 50–51, 53–64, 174/650–669, 66–68.3, 69–73.1, 174/70 S–101.5, 135–212; 29/887
See application file for complete search history.

(56) References Cited

U.S. PATENT DOCUMENTS

| 3,508,587 | A | | 4/1970 | Mauch |
| 4,129,744 | A | * | 12/1978 | Cunningham ......... H01R 4/625 |
| | | | | 174/94 R |

(Continued)

FOREIGN PATENT DOCUMENTS

| EP | 1355102 A1 | 10/2003 |
| EP | 2112731 A1 | 10/2009 |

(Continued)

OTHER PUBLICATIONS

International Search Report mailed Jul. 23, 2014 (PCT/US2014/018917).

*Primary Examiner* — Courtney Smith
*Assistant Examiner* — Rashen E Morrison
(74) *Attorney, Agent, or Firm* — Robert L. Stearns; Dickinson Wright, PLLC

(57) ABSTRACT

A self-wrapping, textile sleeve for routing and protecting elongate members from electromagnetic interference and a method of construction thereof is provided. The sleeve has an elongate wall constructed from interlaced yarns. At least one of the yarns is provided as heat-settable polymeric yarn that is heat-set to bias the wall into a self-wrapping configuration about a longitudinal central axis of the sleeve to bring opposite edges into overlapping relation with one another to provide a generally tubular cavity in which the elongate members are received. Further, at least one of the yarns is provided as a bi-component metallic wire having an aluminum core and an outer layer of copper.

7 Claims, 1 Drawing Sheet

(51) Int. Cl.
  *H02G 3/04* (2006.01)
  *D03D 15/00* (2006.01)
  *H02G 15/18* (2006.01)

(56) References Cited

U.S. PATENT DOCUMENTS

| | | | | |
|---|---|---|---|---|
| 4,237,174 A | * | 12/1980 | Lagardere | B29C 61/10 138/168 |
| 4,246,687 A | * | 1/1981 | Nolf | B29C 61/0641 174/DIG. 8 |
| 4,281,211 A | | 7/1981 | Tatum et al. | |
| 4,289,553 A | * | 9/1981 | Nolf | B23P 11/025 156/86 |
| 4,399,840 A | * | 8/1983 | Lee | B29C 61/10 138/103 |
| 4,647,718 A | * | 3/1987 | Pokojny | H02G 15/1806 156/49 |
| 4,849,580 A | * | 7/1989 | Reuter | G02B 6/4447 156/49 |
| 4,939,819 A | * | 7/1990 | Moyer | H02G 3/0481 24/16 R |
| 4,946,722 A | | 8/1990 | Moyer | |
| 5,403,977 A | * | 4/1995 | Steptoe | H01R 4/70 156/49 |
| 5,828,003 A | * | 10/1998 | Thomeer | E21B 17/06 138/123 |
| 6,639,148 B2 | | 10/2003 | Marks | |
| 7,576,286 B2 | * | 8/2009 | Chen | D02G 3/441 174/117 M |
| 8,273,429 B2 | * | 9/2012 | Sellis | B32B 5/26 428/35.8 |
| 8,283,563 B2 | | 10/2012 | Harris et al. | |
| 2005/0027339 A1 | * | 2/2005 | Schrom | A61N 1/06 607/116 |
| 2009/0272570 A1 | | 11/2009 | Chen | |
| 2010/0054690 A1 | * | 3/2010 | Cline | G02B 6/2558 385/144 |
| 2010/0084179 A1 | * | 4/2010 | Harris | D02G 3/441 174/350 |
| 2011/0123759 A1 | * | 5/2011 | Rodrigues | H02G 3/0481 428/100 |
| 2012/0315413 A1 | | 12/2012 | Kashihara | |
| 2014/0151084 A1 | * | 6/2014 | Spalding | H01B 3/30 174/120 SR |

FOREIGN PATENT DOCUMENTS

| | | |
|---|---|---|
| EP | 2524983 A2 | 11/2012 |
| JP | 2004190194 A | 7/2004 |
| WO | WO2011028460 | 3/2011 |

\* cited by examiner

SELF-WRAPPING EMI SHIELDING TEXTILE SLEEVE AND METHOD OF CONSTRUCTION THEREOF

BACKGROUND OF THE INVENTION

1. Technical Field

This invention relates generally to sleeves for protecting elongate members, and more particularly to self-wrapping textile sleeves.

2. Related Art

It is known to wrap wires and wire harnesses in protective sleeves, such as in automobiles, aircraft or aerospace craft, to provide protection to the wires against abrasion, fluid and thermal effects. In order to achieve the desired protection, the protective sleeve may have multiple layers, with some of the layers being specifically provided for different types of protection. For example, one layer may be provided for water resistance, e.g. a sheet of plastic material, while another layer may be provided for abrasion resistance, and yet another layer may be provided for protection against thermal conditions, e.g. a non-woven layer, and yet another layer constructed of copper wire may be provided for protection against electromagnet interference. Unfortunately, although the aforementioned multilayer sleeves may provide suitable protection against the various environmental and electromagnetic conditions, they typically are bulky and high mass, particularly resulting from solid copper wire, thereby being relatively heavy and exhibiting limited flexibility. This can prove troublesome in some applications, particularly applications requiring routing through tight, winding areas, and applications having weight restrictions, such as aircraft and aerospace applications, for example. In addition, the multilayered sleeves typically come at an increased cost.

SUMMARY OF THE INVENTION

One aspect of the invention provides a self-wrapping, textile sleeve for routing and protecting elongate members against electromagnetic interference is provided. The sleeve has an elongate wall constructed from interlaced yarns. At least one of the yarns is provided as heat-settable polymeric yarn that is heat-set to bias the wall into a self-wrapping configuration about a longitudinal central axis of the sleeve to bring opposite edges into overlapping relation with one another to provide a generally tubular cavity in which the elongate members are received. Further, at least one of the yarns is provided as a bi-component metallic wire having an aluminum core and an outer layer of copper.

In accordance with another aspect of the invention, the self-wrapping, textile sleeve is woven from a plurality of the polymeric yarns with at least some of the polymeric yarns extending in a fill direction.

In accordance with another aspect of the invention, the self-wrapping, textile sleeve is woven with a plurality of the bi-component yarns. At least some of the bi-component yarns extend generally parallel to the longitudinal central axis and at least some of the bi-component yarns extend in a fill direction transverse to the longitudinal central axis.

In accordance with another aspect of the invention, a method of constructing a self-wrapping, textile sleeve for routing and protecting elongate members against electromagnet interference is provided. The method includes interlacing heat-settable polymeric yarns with bi-component metallic wires having an aluminum core and an outer layer of copper to form an elongate wall having opposite edges extending between opposite ends. Further, heat-setting the heat-settable polymeric yarns to bias the opposite edges of the wall into a self-wrapping configuration about a longitudinal central axis of the sleeve to bring the opposite edges into overlapping relation with one another and forming a generally tubular cavity in which the elongate members are received.

In accordance with another aspect of the invention, the method includes weaving at least some of the polymeric yarns in a fill direction transverse to the central longitudinal axis and weaving at least some of the bi-component yarns in a warp direction extending generally parallel to the longitudinal central axis and at least some of the bi-component yarns extending in the fill direction.

In accordance with another aspect of the invention, the method includes bringing the bi-component yarns extending in the warp direction into electrical communication with the bi-component yarns extending in the fill direction.

BRIEF DESCRIPTION OF THE DRAWINGS

These and other aspects, features and advantages will become readily apparent to those skilled in the art in view of the following detailed description of presently preferred embodiments and best mode, appended claims, and accompanying drawings, in which:

DETAILED DESCRIPTION OF PREFERRED EMBODIMENTS

Figure 1:
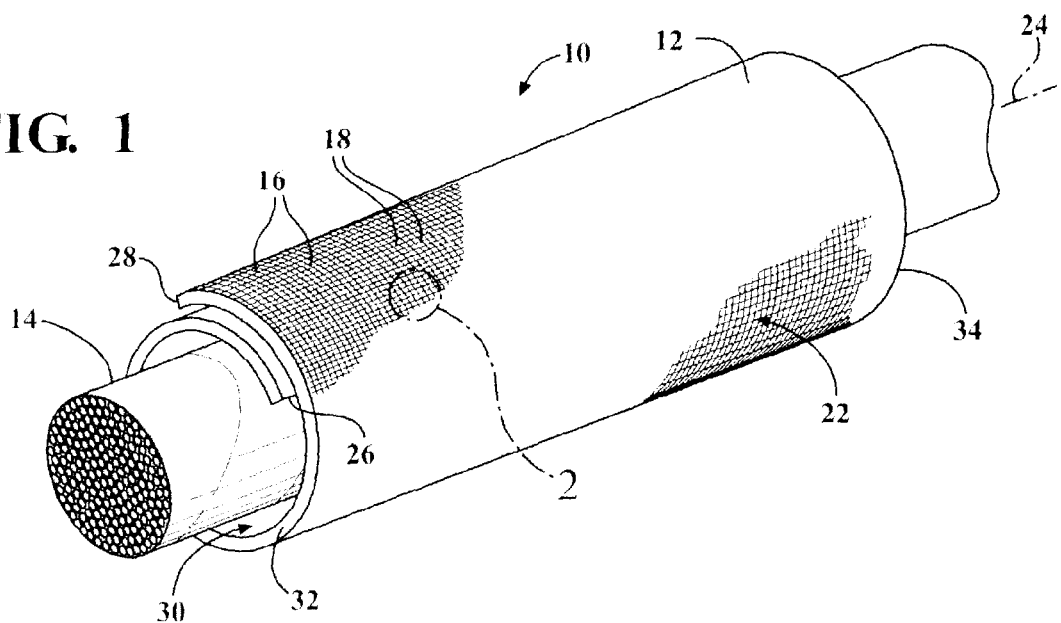
FIG. 1 is a schematic perspective partial view of a textile, self-wrapping sleeve constructed in accordance with one aspect of the invention carrying and protecting elongate members therein.
Figure 2:
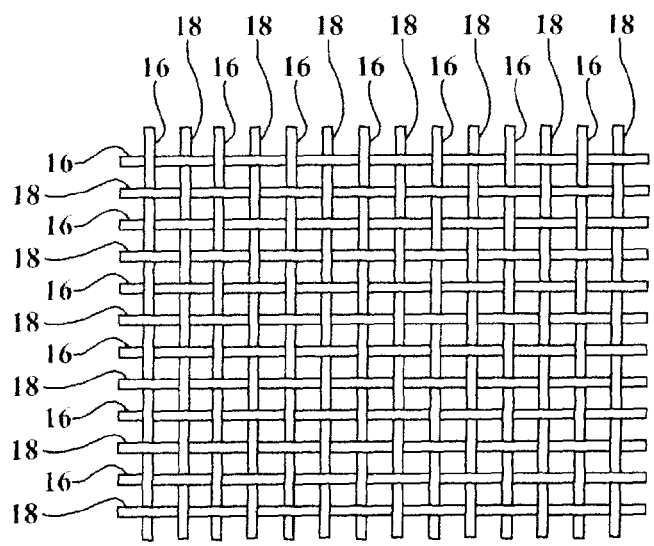
FIG. 2 is a fragmentary view of the encircled area 2 of FIG. 1.
Figure 3:
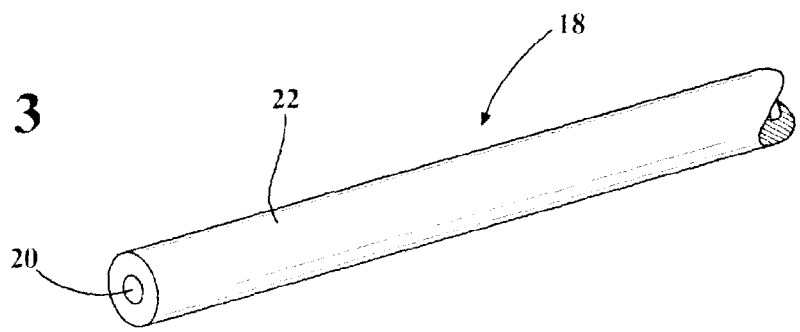
FIG. 3 is a perspective view of a bi-component metallic yarn of the sleeve of FIG. 1.

Referring in more detail to the drawings, FIG. 1 shows a schematic view of textile, self-wrapping sleeve, referred to hereafter as sleeve 10, constructed in accordance with one aspect of the invention. The sleeve 10 has a self-wrapping elongate wall 12, upon being heat-formed, for routing and protecting elongate members, such as wires or a wire harness 14, for example, from exposure to abrasion, thermal and other environmental conditions, such as exposure to fluid, and against electromagnet interference (EMI). The elongate wall 12 is constructed from a plurality of interlaced heat-settable polymeric yarns 16, and to facilitate providing protection against EMI, a plurality of bi-component metallic yarns, also referred to as bi-component wires 18, which consist of a core of aluminum wire 20 and an outer layer of copper 22. The polymeric yarns 16 are heat-set to bias the wall 12 into a self-wrapping tubular configuration about a longitudinal central axis 24 to bring lengthwise extending opposite edges 26, 28 into overlapping relation with one another In addition to the elongate member 14 being protected against EMI, The wall 12 can be constructed having any suitable size, including length, diameter and wall thickness. The opposite edges 26, 28 extend generally parallel to the central axis 18 between opposite ends 32, 34. When the wall 12 is in its self-wrapped tubular configuration, generally free from any externally applied forces, the edges 26, 28 overlap one another at least slightly to fully enclose the cavity 30 circumferentially, and thus, the wall 12 provides enhanced protection to the wires 14 contained in the cavity 20 against EMI about a full circumference of the wall 12. The sides 24, 26 are readily extendable away from one another under an externally applied force to at least partially open and expose the cavity

30. Accordingly, the wires 14 can be readily disposed into the cavity 30 during assembly or removed from the cavity 30 during service. Upon releasing the externally applied force, the edges 26, 28 return automatically under a bias imparted within the polymeric yarns 16 as a result of being heat-set in their curled configuration.

The wall 12 can be constructed at least in part from multifilament and/or monofilament polymeric yarns 16, with at least one or more of the yarns 16 being heat-settable. For example, one or more of the yarns 16 can be provided as a heat-settable polymeric material, such as polyphenylene sulfide (PPS), for example, which can be heat set at a temperature of about 200-225 degrees Celsius. The wall 12 is woven from the heat-settable yarns 16 extending in at least the fill direction, transverse to the longitudinal central axis 24, and can further be woven to extend in a warp direction, generally parallel to the longitudinal central axis 24. Further, the bi-component copper-clad aluminum wires 18 are woven in at least one of the fill and warp directions, and preferably in both the fill and warp direction so as to be brought into conductive, electrical contact with one another to enhance protection against EMI. With the bi-component wires 18 having an aluminum core 20, the wires have a reduced mass relative to solid copper wire, and thus, provide the sleeve 10 with a reduced weight. Meanwhile, with the outer layer of the bi-component wires 18 being provided as a copper layer 20, the wires 18 are provided with the electrical conductivity necessary to provide the desire protection against EMI.

Obviously, many modifications and variations of the present invention are possible in light of the above teachings. It is, therefore, to be understood that within the scope of the appended claims, the invention may be practiced otherwise than as specifically described.

What is claimed is:

1. A self-wrapping, textile sleeve for routing and protecting elongate members against electromagnetic interference, comprising:
    an elongate wall constructed from interlaced yarns, at least one of said yarns being a heat-settable polymeric yarn that is heat-set to bias said wall into a self-wrapping configuration about a longitudinal central axis of said sleeve to bring opposite edges into overlapping relation with one another to provide a generally tubular cavity in which the elongate members are received; and
    at least one of said yarns being provided as a bi-component metallic wire having an inner aluminum wire core and an outer copper sheath encasing said inner aluminum wire core.

2. The self-wrapping, textile sleeve of claim 1 wherein said wall is woven from a plurality of said at least one polymeric yarn with at least some of said polymeric yarns extending in a fill direction.

3. The self-wrapping, textile sleeve of claim 2 wherein said at least one bi-component yarn includes a plurality of said bi-component yarns, at least some of said bi-component yarns extending generally parallel to said longitudinal central axis and at least some of said bi-component yarns extending in a fill direction transverse to said longitudinal central axis.

4. The self-wrapping, textile sleeve of claim 3 wherein said bi-component yarns extending in said warp direction are in electrical communication with said bi-component yarns extending in said fill direction.

5. A method of constructing a self-wrapping, textile sleeve for routing and protecting elongate members against electromagnetic interference, comprising:
    interlacing heat-settable polymeric yarns with bi-component metallic wires having an inner aluminum wire core and an outer copper sheath covering the inner aluminum wire core to form an elongate wall having opposite edges extending between opposite ends; and
    heat-setting the heat-settable polymeric yarns to bias the opposite edges of the wall into a self-wrapping configuration about a longitudinal central axis of the sleeve to bring the opposite edges into overlapping relation with one another and forming a generally tubular cavity in which the elongate members are received.

6. The method of claim 5 further including weaving at least some of the polymeric yarns in a fill direction transverse to the central longitudinal axis and weaving at least some of the bi-component yarns in a warp direction extending generally parallel to the longitudinal central axis and at least some of the bi-component yarns extending in the fill direction.

7. The method of claim 6 further including bringing the bi-component yarns extending in the warp direction into electrical communication with the bi-component yarns extending in the fill direction.

* * * * *